United States Patent
Liao

(10) Patent No.: US 10,912,189 B2
(45) Date of Patent: Feb. 2, 2021

(54) CIRCUIT BOARD

(71) Applicant: PEGATRON CORPORATION, Taipei (TW)

(72) Inventor: Te-Yu Liao, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/601,342

(22) Filed: Oct. 14, 2019

(65) Prior Publication Data
US 2020/0045809 A1 Feb. 6, 2020

Related U.S. Application Data

(62) Division of application No. 16/022,532, filed on Jun. 28, 2018, now abandoned.

(30) Foreign Application Priority Data

Aug. 23, 2017 (TW) .............................. 106128590 A

(51) Int. Cl.
| | |
|---|---|
| *H05K 1/02* | (2006.01) |
| *H05K 1/11* | (2006.01) |
| *H01R 13/6461* | (2011.01) |

(52) U.S. Cl.
CPC ....... *H05K 1/0245* (2013.01); *H01R 13/6461* (2013.01); *H05K 1/114* (2013.01); *H05K 1/0216* (2013.01); *H05K 1/0228* (2013.01); *H05K 1/11* (2013.01); *H05K 2201/09236* (2013.01); *H05K 2201/09409* (2013.01)

(58) Field of Classification Search
CPC ................. H05K 1/0245; H05K 1/114; H05K 2201/09409; H05K 2201/09236; H05K 1/0216; H01R 13/6461
See application file for complete search history.

(56) References Cited

U.S. PATENT DOCUMENTS

| | | | | |
|---|---|---|---|---|
| 6,462,423 | B1 * | 10/2002 | Akram | H01L 23/49822 257/666 |
| 6,753,594 | B2 * | 6/2004 | Hauser | H01L 23/49838 257/668 |
| 2006/0208351 | A1 * | 9/2006 | Poo | H01L 25/105 257/693 |
| 2010/0051341 | A1 * | 3/2010 | Cheng | H01L 23/13 174/261 |

* cited by examiner

*Primary Examiner* — Ishwarbhai B Patel
(74) *Attorney, Agent, or Firm* — J.C. Patents

(57) ABSTRACT

A circuit board is provided. The circuit board includes a first pin row, a second pin row and a plurality of signal vias. The first pin row includes a first side and a second side, wherein the first side of the first pin row and the second side of the first pin row are opposite to each other. The second pin row includes a first side and a second side, wherein the first side of the second pin row and the second side of the second pin row are opposite to each other. A plurality of traces of the circuit board are electrically connected to a plurality of pins of the first pin row and a plurality of pins of the second pin row respectively through the signal vias. Three consecutive signal vias of the signal vias are sequentially disposed at the first side of the first pin row, the first side of the second pin row, and the second side of the first pin row.

3 Claims, 10 Drawing Sheets

CIRCUIT BOARD

CROSS-REFERENCE TO RELATED APPLICATION

This application is a divisional application of and claims the priority benefit of U.S. application Ser. No. 16/022,532, filed on Jun. 28, 2018, now abandoned, which claims the priority benefit of Taiwan application serial no. 106128590, filed on Aug. 23, 2017. The entirety of each of the above-mentioned patent applications is hereby incorporated by reference herein and made a part of this specification.

BACKGROUND

Technical Field

The invention relates to a circuit board. More particularly, the invention relates to a circuit board capable of improving signal quality.

Description of Related Art

Generally, a plurality of signal vias are disposed on a printed circuit board to enable signal transmission among the elements of the printed circuit board through signal traces of each of the layers of the printed circuit board as well as the corresponding signal vias. In the current printed circuit board design, how the signal traces can be laid out more conveniently determines the positions in which the signal vias are disposed most of the time. In this way, however, distances between the signal vias may be too close to each other. When the signal vias are disposed too close to each other, greater crosstalk interference is generated, and signal quality of the circuit board is thus affected.

SUMMARY

The invention provides a circuit board in which a plurality of signal vias of at least one pin row of the circuit board are alternately disposed at different sides of the at least one pin row to prevent the signal vias from being disposed too close to each other for increasing signal quality of the at least one pin row.

In an embodiment of the invention, a circuit board includes a first pin row, a second pin row, and a plurality of signal vias. The first pin row has a first side and a second side, wherein the first side of the first pin row and the second side of the first pin row are opposite to each other. The second pin row has a first side and a second side, wherein the first side of the second pin row and the second side of the second pin row are opposite to each other, and one of the first side and the second side of the second pin row is adjacent to one of the first side and the second side of the first pin row. A plurality of traces of the circuit board are electrically connected to a plurality of pins of the first pin row and a plurality of pins of the second pin row respectively through the signal vias. Three consecutive signal vias of the signal vias are sequentially disposed at the first side of the first pin row, the first side of the second pin row, and the second side of the first pin row.

In an embodiment of the invention, the circuit board further includes a third pin row. The third pin row has a first side and a second side. The first side of the third pin row and the second side of the third pin row are opposite to each other, and one of the first side and the second side of the third pin row is adjacent to one of the first side and the second side of the second pin row. Four consecutive signal vias of the signal vias are sequentially disposed at the first side of the first pin row, the first side of the second pin row, the first side of the third pin row, and the second side of the first pin row.

In an embodiment of the invention, a circuit board includes N pin rows and a plurality of signal vias. Each of the N pin rows has a first side and a second side. The first side and the second side of each of the N pin rows are opposite to each other. One of the first side and the second side of a Jth pin row of the N pin rows is adjacent to one of the first side and the second side of a J-1th pin row of the N pin rows, wherein N is an integer greater than or equal to 3. A plurality of traces of the circuit board are electrically connected to a plurality of pins of the N pin row respectively through the signal vias. M consecutive signal vias of the signal vias are sequentially disposed at the first side of each of the N pin rows and the second side of a first pin row of the N pin rows, wherein M=N+1.

To sum up, in the circuit board provided by the embodiments of the invention, the signal vias of the at least one pin row of the circuit board are alternately disposed at two opposite sides of the at least one pin row. In this way, the signal vias are prevented from being located too close to each other, and therefore, signal quality of the at least one pin row of the circuit board is increased.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
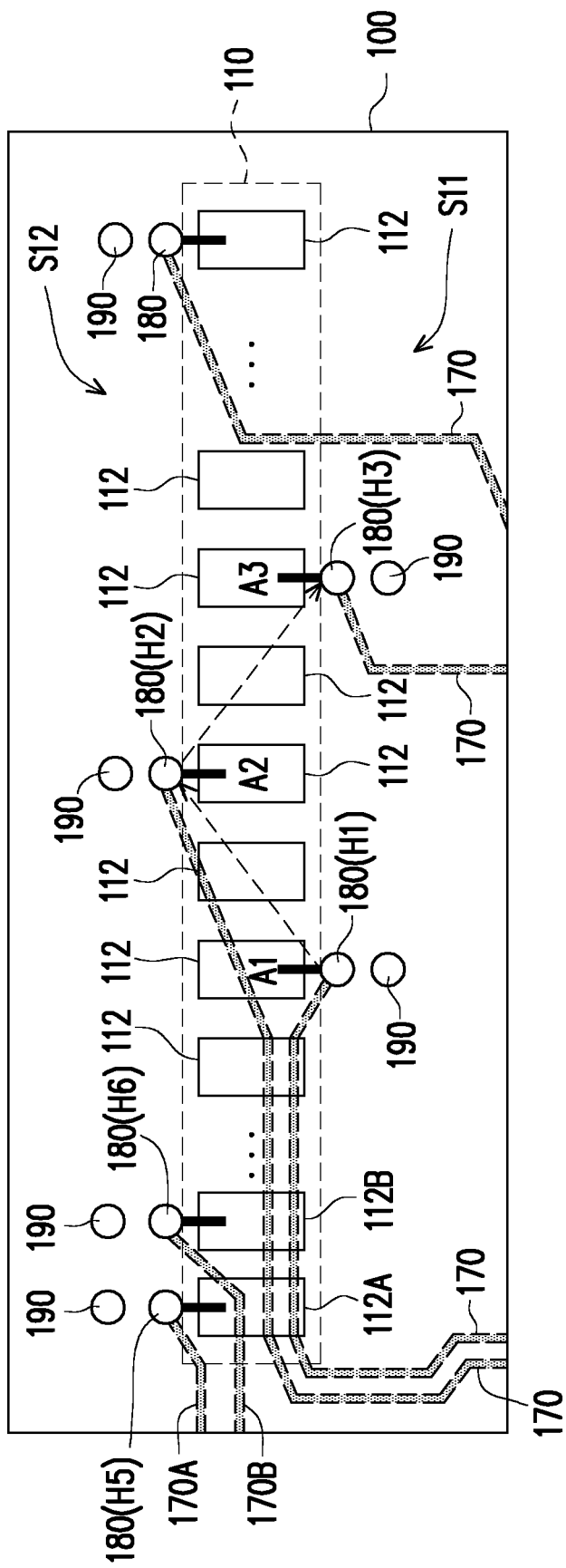
FIG. 1 is a schematic diagram illustrating implementation of a circuit board according to an embodiment of the invention.

In order to make the invention more comprehensible, several embodiments are described below as examples of implementation of the invention. In addition, wherever possible, identical or similar reference numerals stand for identical or similar elements/components in the drawings and the embodiments.

With reference to FIG. 1, FIG. 1 is a schematic diagram illustrating implementation of a circuit board according to an embodiment of the invention. A circuit board 100 includes a first pin row 110 and a plurality of signal vias 180. In an embodiment of the invention, the first pin row 110 may be, for example, a single row of pins of a surface-mount technology (SMT) connector, which should however not be construed as limitations to the invention. The first pin row 110 has a plurality of pins 112 sequentially arranged, and each of the signal vias 180 is adjacent to a corresponding one of the pins 112. A plurality of traces 170 of the circuit board 100 may be electrically connected to the pins 112 of the first pin row 110 respectively through the signal vias 180. For instance, a signal via H1 is adjacent to a pin A1 of the first pin row 110, and a first trace of the circuit board 100 may be electrically connected to the pin A1 through the signal via H1; a signal via H2 is adjacent to a pin A2 of the first pin row 110, and a second trace of the circuit board 100 may be electrically connected to the pin A2 through the signal via H2; a signal via H3 is adjacent to a pin A3 of the first pin row 110, and a third trace of the circuit board 100 may be electrically connected to the pin A3 through the signal via H3. Nevertheless, the invention should not be construed as limited thereto. In fact, whether the signal via corresponding to each of the pins of the first pin row 110 is required to be disposed depends on actual applications or design requirements.

In addition, the first pin row 110 includes a first side S11 and a second side S12, wherein the first side S11 and the second side S12 are opposite to each other. Particularly, the three consecutive signal vias H1, H2, and H3 of the signal vias 180 are sequentially disposed at the first side S11 of the first pin row 110, the second side S12 of the first pin row 110, and the first side S11 of the first pin row 110. Alternate arrangement of the signal vias H1, H2, and H3 as shown by the dashed arrows in FIG. 1 is thereby formed. In this way, the signal vias H1, H2, and H3 are prevented from being disposed together at the same side (e.g., the first side S11) of the first pin row 110. As such, the signal vias H1, H2, and H3 are prevented from being located too close to each other, and that crosstalk interference is prevented from being generated. Signal quality of the signal vias H1, H2, and H3 of the circuit board 100 is thereby increased.

In an embodiment of the invention, the signal vias 180 of FIG. 1 may include a differential signal pair via (e.g. signal vias 115 and H6), wherein a differential signal pair trace (e.g. traces 170A and 170B) of the circuit board 100 may be electrically connected to a differential signal pair pin (e.g. pins 112A and 112B) of the first pin row 110 through the differential signal pair via. The differential signal pair via is disposed at a same side of the first pin row 110.

In an embodiment of the invention, the signal vias 180 of FIG. 1 may include at least two consecutive grounding vias (not shown), wherein the at least two consecutive grounding vias are both disposed at a same side of the first pin row 110.

In an embodiment of the invention, the circuit board 100 of FIG. 1 may further include a plurality of grounding vias 190, wherein the grounding vias 190 may be distributed around the signal vias 180 for increasing signal quality of the signal vias 180.

Figure 2:
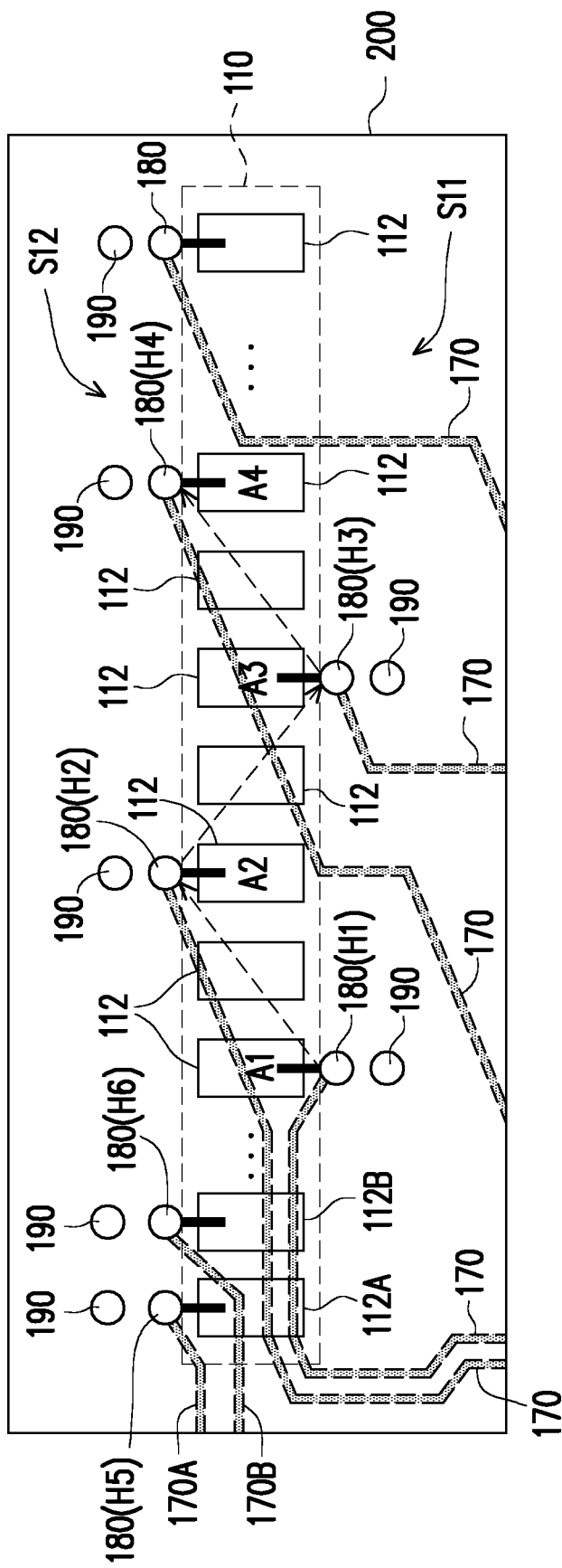
FIG. 2 is a schematic diagram illustrating implementation of a circuit board according to another embodiment of the invention.

FIG. 2 is a schematic diagram illustrating implementation of a circuit board according to another embodiment of the invention. With reference to FIG. 1 and FIG. 2 together, a circuit board 200 of FIG. 2 may also include the first pin row 110 and the signal vias 180, wherein the first pin row 110 has the pins 112 sequentially arranged. The plurality of traces 170 of the circuit board 200 may be electrically connected to the pins 112 of the first pin row 110 respectively through the signal vias 180. Similarly, whether the signal via corresponding to each of the pins of the pins 112 in FIG. 2 is required to be disposed depends on actual applications or design requirements.

Comparing to the three consecutive signal vias H1, H2, and H3 in FIG. 1 which are electrically connected to the pins A1, A2, and A3 respectively and are sequentially disposed at the first side S11 of the first pin row 110, the second side S12 of the first pin row 110, and the first side S11 of the first pin row 110, the four consecutive signal vias H1 to H4 of the signal vias 180 in FIG. 2 are electrically connected to the pins A1 to A4 respectively and are sequentially disposed at the first side S11 of the first pin row 110, the second side S12 of the first pin row 110, the first side S11 of the first pin row 110, and the second side S12 of the first pin row 110. Alternate arrangement of the signal vias H1 to H4 as shown by the dashed arrows in FIG. 2 is thereby formed. In this way, the signal vias H1 to H4 in FIG. 2 are prevented from being disposed together at the same side of the first pin row 110. As such, the signal vias H1 to H4 are prevented from being located too close to each other, and that crosstalk interference is prevented from being generated. Signal quality of the signal vias H1 to H4 of the circuit board 200 is thereby increased. In addition, other implementation details of the circuit board 200 of FIG. 2 may be referred to the related description of the circuit board 100 of FIG. 1, and a relevant description thereof is thus omitted.

It should be understood that five (or more) consecutive signal vias of the signal vias 180 may similarly be disposed sequentially at the first side S11 of the first pin row 110 and the second side S12 of the first pin row 110 in cycles by a designer. That is, the five or more signal vias of the signal vias 180 may be sequentially disposed at different sides of the first pin row 110 for improving signal quality of the circuit board. Thus, details are not repeated hereinafter.

Figure 3A:
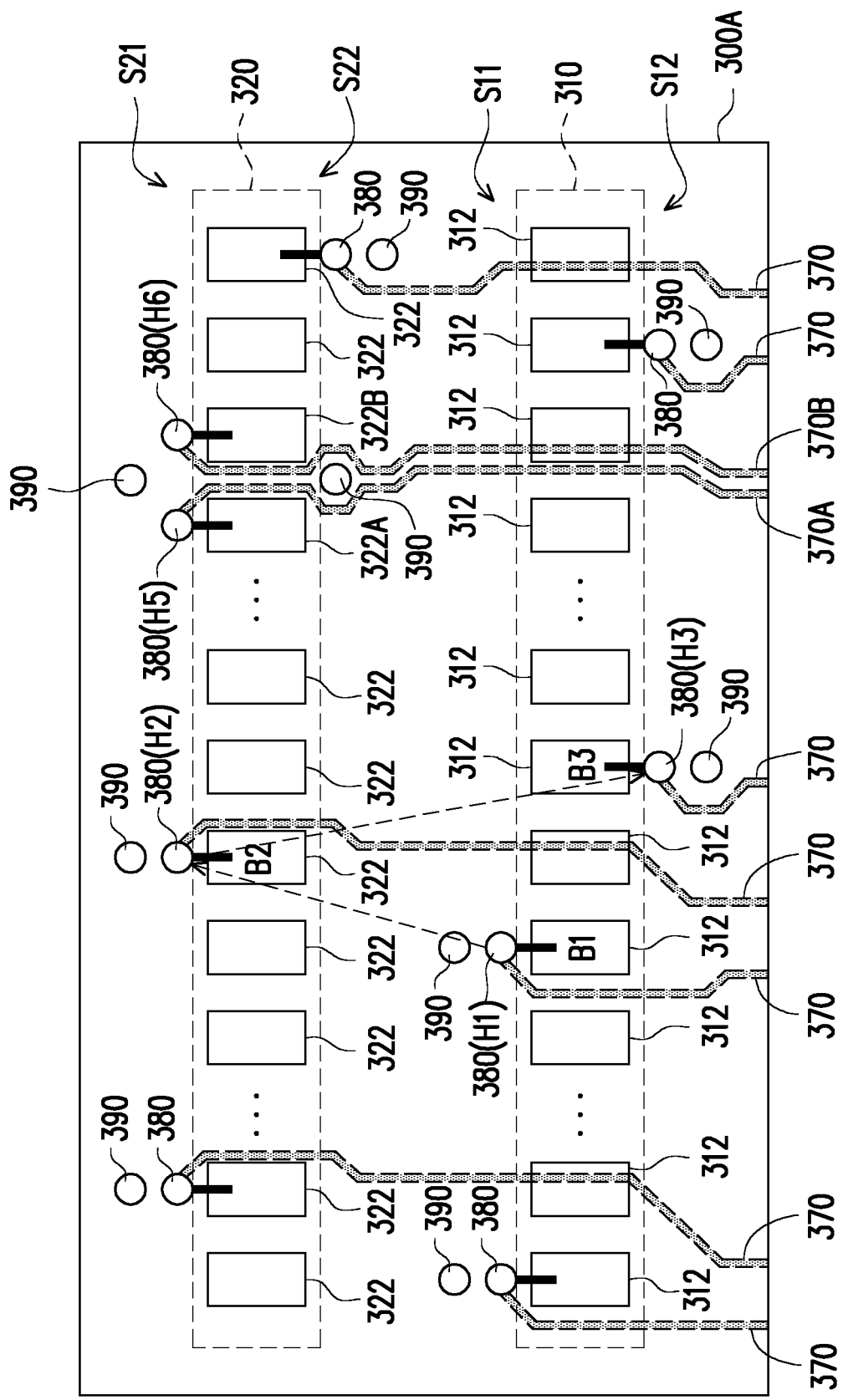
FIG. 3A to FIG. 3D are schematic diagrams illustrating implementation of circuit boards according to still another embodiment of the invention.

FIG. 3A is a schematic diagram illustrating implementation of a circuit board according to still another embodiment of the invention. As shown in FIG. 3A, a circuit board 300A may include a first pin row 310, a second pin row 320, and a plurality of signal vias 380. In an embodiment of the invention, the first pin row 310 and the second pin row 320 may be, for example, double rows of pins of a surface-mount technology connector, which should however not be construed as limitations to the invention. The first pin row 310 has a plurality of pins 312 sequentially arranged, and the second pin row 320 has a plurality of pins 322 sequentially arranged. Moreover, each of the signal vias 380 is adjacent to a corresponding one pin of the pins 312 and 322. A plurality of traces 370 of the circuit board 300A may be electrically connected to the pins 312 of the first pin row 310 and the pins 322 of the second pin row 320 respectively through the signal vias 380. For instance, the signal via H1 is adjacent to a pin B1 of the first pin row 310, and a first trace of the circuit board 300A may be electrically connected to the pin B1 of the first pin row 310 through the signal via H1; the signal via H2 is adjacent to a pin B2 of the second pin row 320, and a second trace of the circuit board 300A may be electrically connected to the pin B2 of the second pin row 320 through the signal via H2; the signal via H3 is adjacent to a pin B3 of the first pin row 310, and a third trace of the circuit board 300A may be electrically connected to the pin B3 of the first pin row 310 through the signal via H3. Nevertheless, the invention should not be construed as limited thereto. In fact, whether the signal via corresponding to each of the pins in the first pin row 310 and the second pin row 320 is required to be disposed depends on actual applications or design requirements.

The first pin row 310 includes a first side S11 and a second side S12, wherein the first side S11 and the second side S12 are opposite to each other. The second pin row 320 has a first side S21 and a second side S22, wherein the first side S21 and the second side S22 are opposite to each other, and the second side S22 of the second pin row 320 is adjacent to the first side S11 of the first pin row 310. The three consecutive signal vias H1, H2, and H3 of the signal vias 380 are sequentially disposed at the first side S11 of the first pin row 310, the first side S21 of the second pin row 320, and the second side S12 of the first pin row 310. Alternate arrangement of the signal vias H1, H2, and H3 as shown by the dashed arrows in FIG. 3A is thereby formed. In this way, the signal vias H1, H2, and H3 are prevented from being located too close to each other, and that crosstalk interference is prevented from being generated. Signal quality of the signal vias H1, H2, and H3 of the circuit board 300A is thereby increased.

Figure 3B:
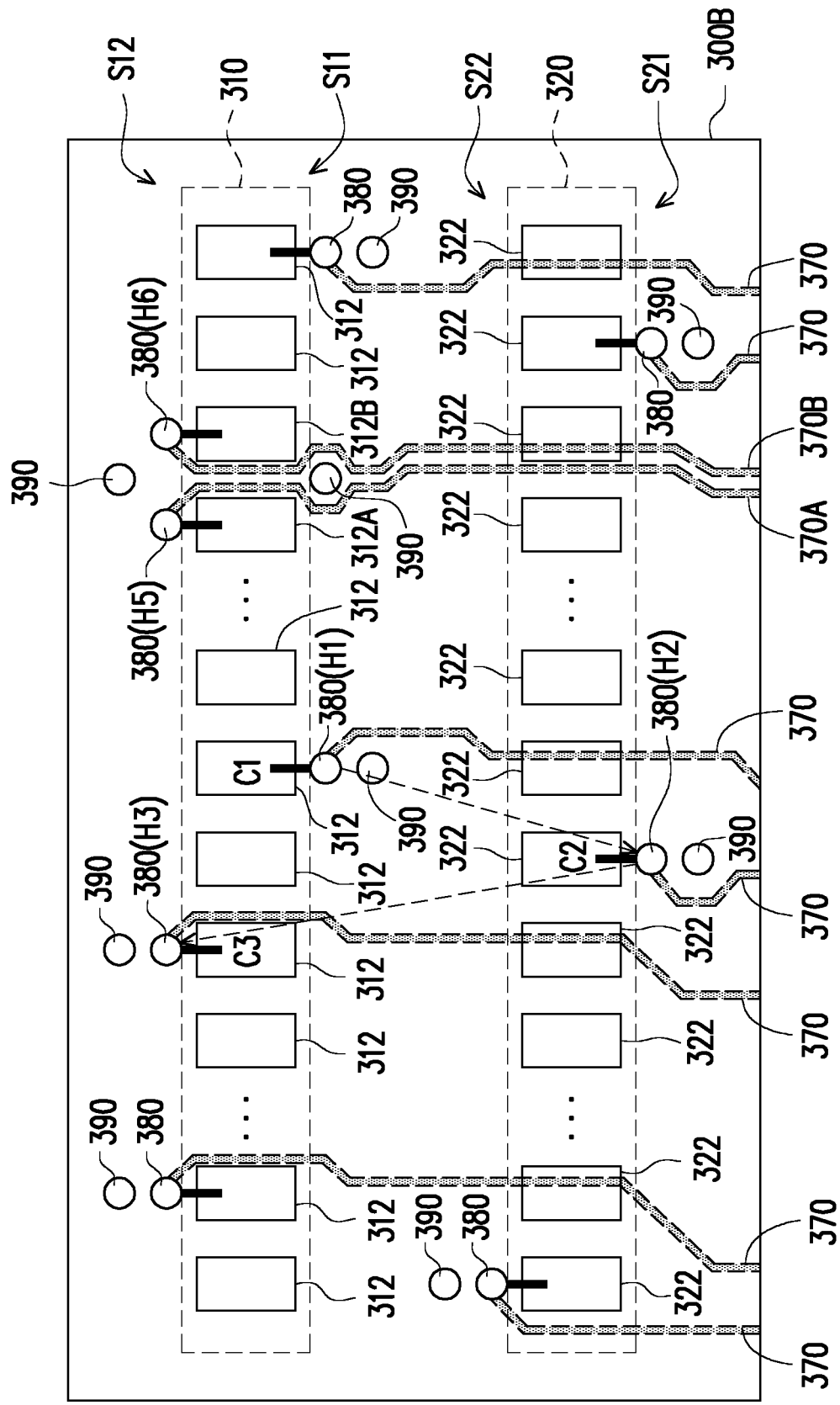

FIG. 3B is a schematic diagram illustrating implementation of a circuit board according to still another embodiment of the invention. As shown in FIG. 3B, a circuit board 300B may include a first pin row 310, a second pin row 320, and a plurality of signal vias 380. The first pin row 310 has a plurality of pins 312 sequentially arranged, and the second pin row 320 has a plurality of pins 322 sequentially arranged. Moreover, each of the signal vias 380 is adjacent to a corresponding one pin of the pins 312 and 322. A plurality of traces 370 of the circuit board 300B may be electrically connected to the pins 312 of the first pin row 310 and the pins 322 of the second pin row 320 respectively through the signal vias 380. For instance, the signal via H1 is adjacent to a pin C1 of the first pin row 310, and a first trace of the circuit board 300B may be electrically connected to the pin C1 of the first pin row 310 through the signal via H1; the signal via H2 is adjacent to a pin C2 of the second pin row 320, and a second trace of the circuit board 300B may be electrically connected to the pin C2 of the second pin row 320 through the signal via H2; the signal via H3 is adjacent to a pin C3 of the first pin row 310, and a third trace of the circuit board 300B may be electrically connected to the pin C3 of the first pin row 310 through the signal via H3. Nevertheless, the invention should not be construed as limited thereto. In fact, whether the signal via corresponding to each of the pins of the first pin row 310 and the second pin row 320 is required to be disposed depends on actual applications or design requirements.

The first pin row 310 includes a first side S11 and a second side S12, wherein the first side S11 and the second side S12 are opposite to each other. The second pin row 320 includes a first side S21 and a second side S22, wherein the first side S21 and the second side S22 are opposite to each other, and the second side S22 of the second pin row 320 is adjacent to the first side S11 of the first pin row 310. The three consecutive signal vias H1, H2, and H3 of the signal vias 380 are sequentially disposed at the first side S11 of the first pin row 310, the first side S21 of the second pin row 320, and the second side S12 of the first pin row 310. Alternate arrangement of the signal vias H1, H2, and H3 as shown by the dashed arrows in FIG. 3B is thereby formed. In this way, the signal vias H1, H2, and H3 are prevented from being located too close to each other, and that crosstalk interference is prevented from being generated. Signal quality of the signal vias H1, H2, and H3 of the circuit board 300B is thereby increased.

Figure 3C:
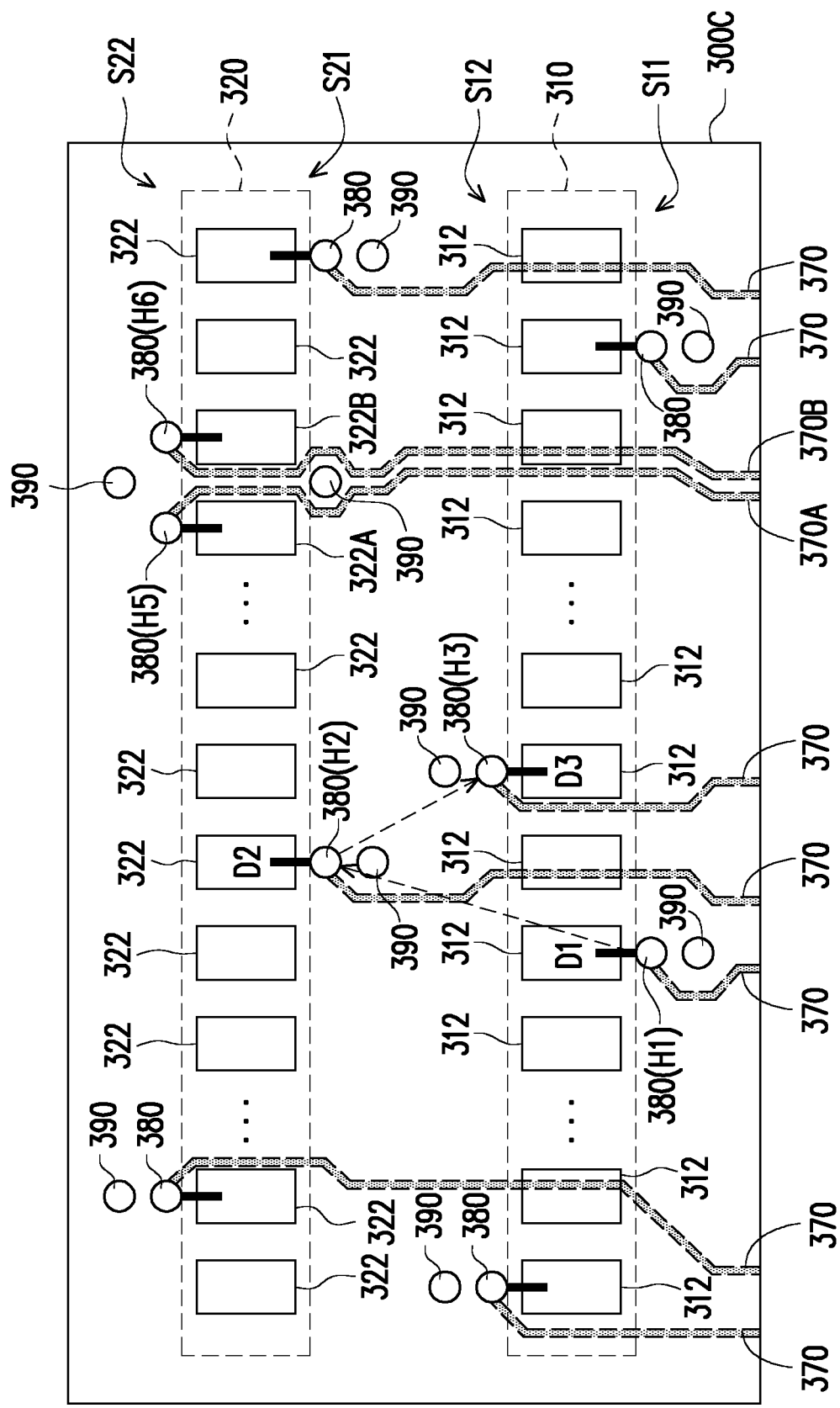

FIG. 3C is a schematic diagram illustrating implementation of a circuit board according to still another embodiment of the invention. As shown in FIG. 3C, a circuit board 300C may include a first pin row 310, a second pin row 320, and a plurality of signal vias 380. The first pin row 310 has a plurality of pins 312 sequentially arranged, and the second pin row 320 has a plurality of pins 322 sequentially arranged. Moreover, each of the signal vias 380 is adjacent to a corresponding one pin of the pins 312 and 322. A plurality of traces 370 of the circuit board 300C may be electrically connected to the pins 312 of the first pin row 310 and the pins 322 of the second pin row 320 respectively through the signal vias 380. For instance, the signal via H1 is adjacent to a pin D1 of the first pin row 310, and a first trace of the circuit board 300C may be electrically connected to the pin D1 of the first pin row 310 through the signal via H1; the signal via H2 is adjacent to a pin D2 of the second pin row 320, and a second trace of the circuit board 300C may be electrically connected to the pin D2 of the second pin row 320 through the signal via H2; the signal via H3 is adjacent to a pin D3 of the first pin row 310, and a third trace of the circuit board 300C may be electrically connected to the pin D3 of the first pin row 310 through the signal via H3. Nevertheless, the invention should not be construed as limited thereto. In fact, whether the signal via corresponding to each of the pins of the first pin row 310 and the second pin row 320 is required to be disposed depends on actual applications or design requirements.

The first pin row 310 includes a first side S11 and a second side S12, wherein the first side S11 and the second side S12 are opposite to each other. The second pin row 320 includes a first side S21 and a second side S22, wherein the first side S21 and the second side S22 are opposite to each other, and the first side S21 of the second pin row 320 is adjacent to the second side S12 of the first pin row 310. The three consecutive signal vias H1, H2, and H3 of the signal vias 380 are sequentially disposed at the first side S11 of the first pin row 310, the first side S21 of the second pin row 320, and the second side S12 of the first pin row 310. Alternate arrangement of the signal vias H1, H2, and H3 as shown by the dashed arrows in FIG. 3C is thereby formed. In this way, the signal vias H1, H2, and H3 are prevented from being located too close to each other, and that crosstalk interference is prevented from being generated. Signal quality of the signal vias H1, H2, and H3 of the circuit board 300C is thereby increased.

Figure 3D:
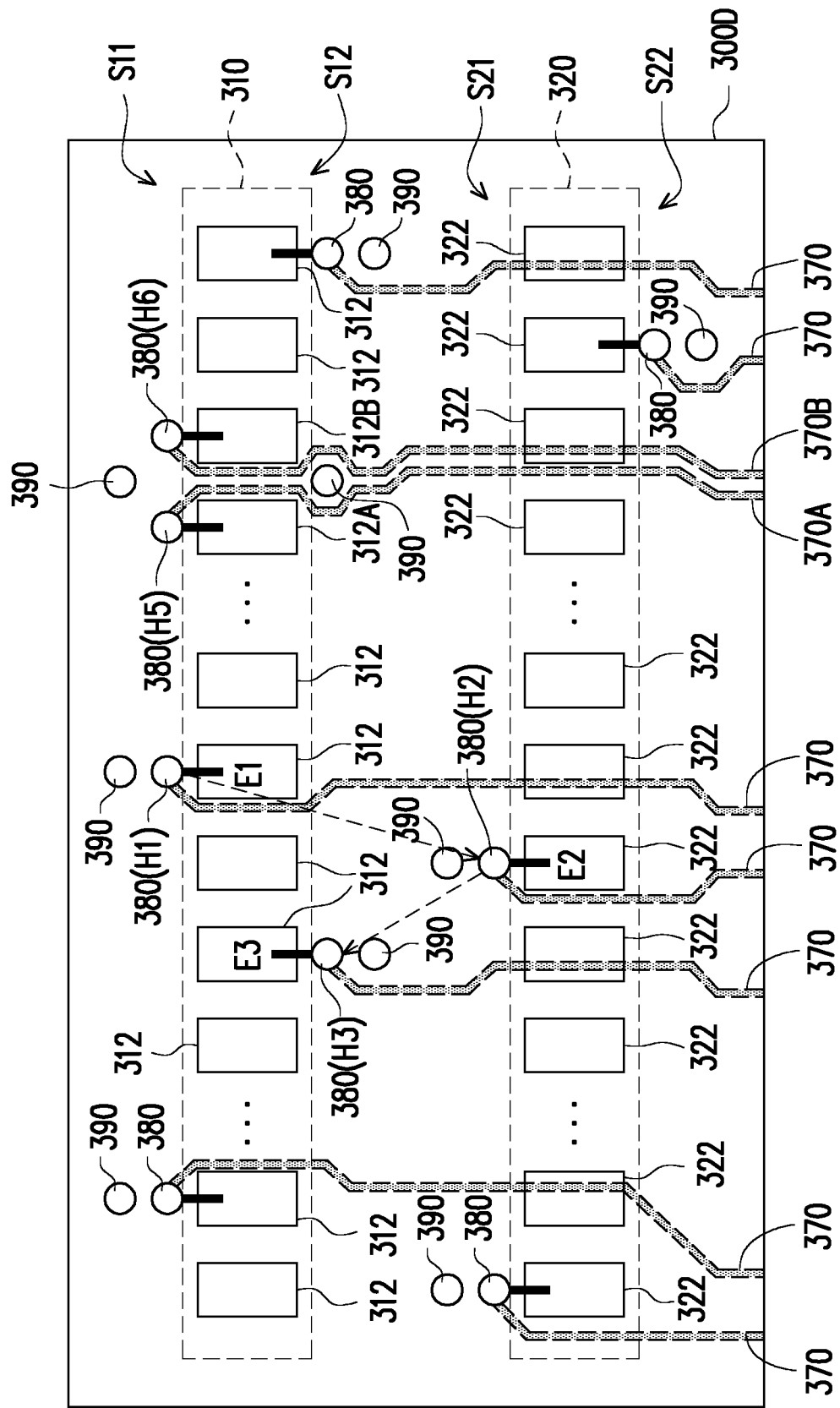

FIG. 3D is a schematic diagram illustrating implementation of a circuit board according to still another embodiment of the invention. As shown in FIG. 3D, a circuit board 300D may include a first pin row 310, a second pin row 320, and a plurality of signal vias 380. The first pin row 310 has a plurality of pins 312 sequentially arranged, and the second pin row 320 has a plurality of pins 322 sequentially arranged. Moreover, each of the signal vias 380 is adjacent to a corresponding one pin of the pins 312 and 322. A plurality of traces 370 of the circuit board 300D may be electrically connected to the pins 312 of the first pin row 310 and the pins 322 of the second pin row 320 respectively through the signal vias 380. For instance, a signal via H1 is adjacent to a pin E1 of the first pin row 310, and a first trace of the circuit board 300D may be electrically connected to the pin E1 of the first pin row 310 through the signal via H1; a signal via H2 is adjacent to a pin E2 of the second pin row 320, and a second trace of the circuit board 300D may be electrically connected to the pin E2 of the second pin row 320 through the signal via H2; a signal via H3 is adjacent to a pin E3 of the first pin row 310, and a third trace of the circuit board 300D may be electrically connected to the pin E3 of the first pin row 310 through the signal via H3. Nevertheless, the invention should not be construed as limited thereto. In fact, whether the signal via corresponding to each of the pins in the first pin row 310 and the second pin row 320 is required to be disposed depends on actual applications or design requirements.

The first pin row 310 includes a first side S11 and a second side S12, wherein the first side S11 and the second side S12 are opposite to each other. The second pin row 320 includes a first side S21 and a second side S22, wherein the first side S21 and the second side S22 are opposite to each other, and the first side S21 of the second pin row 320 is adjacent to the second side S12 of the first pin row 310. The three consecutive signal vias H1, H2, and H3 of the signal vias 380 are sequentially disposed at the first side S11 of the first pin row 310, the first side S21 of the second pin row 320, and the second side S12 of the first pin row 310. Alternate arrangement of the signal vias H1, H2, and H3 as shown by the dashed arrows in FIG. 3D is thereby formed. In this way, the signal vias H1, H2, and H3 are prevented from being located too close to each other, and that crosstalk interference is prevented from being generated. Signal quality of the signal vias H1, H2, and H3 of the circuit board 300D is thereby increased.

In an embodiment of the invention, the signal vias 380 of each of the circuit boards 300A to 300D of FIG. 3A to FIG. 3D may include a differential signal pair via (e.g. signal vias H5 and H6). A differential signal pair trace (e.g. traces 370A and 370B) of each of the circuit boards 300A to 300D may be electrically connected to a differential signal pair pin (e.g. pins 312A and 312B in FIG. 3A) of the first pin row 310 or a differential signal pair pin (e.g. pins 322A and 322B in FIG. 3C) of the second pin row 320 through the differential signal pair via. Moreover, the differential signal pair vias are disposed at the same side of the first pin row 310 or the same side of the second pin row 320.

In an embodiment of the invention, the signal vias 380 of each of the circuit boards 300A to 300D of FIG. 3A to FIG. 3D may include at least two consecutive grounding vias (not shown). The at least two consecutive grounding vias are both disposed at the same side of the first pin row 310 or the same side of the second pin row 320.

In an embodiment of the invention, each of the circuit boards 300A to 300D of FIG. 3A to FIG. 3D may further include a plurality of grounding vias (not shown). The grounding vias may be distributed around the signal vias 380 so as to increase signal quality of the signal vias 380.

Figure 4:
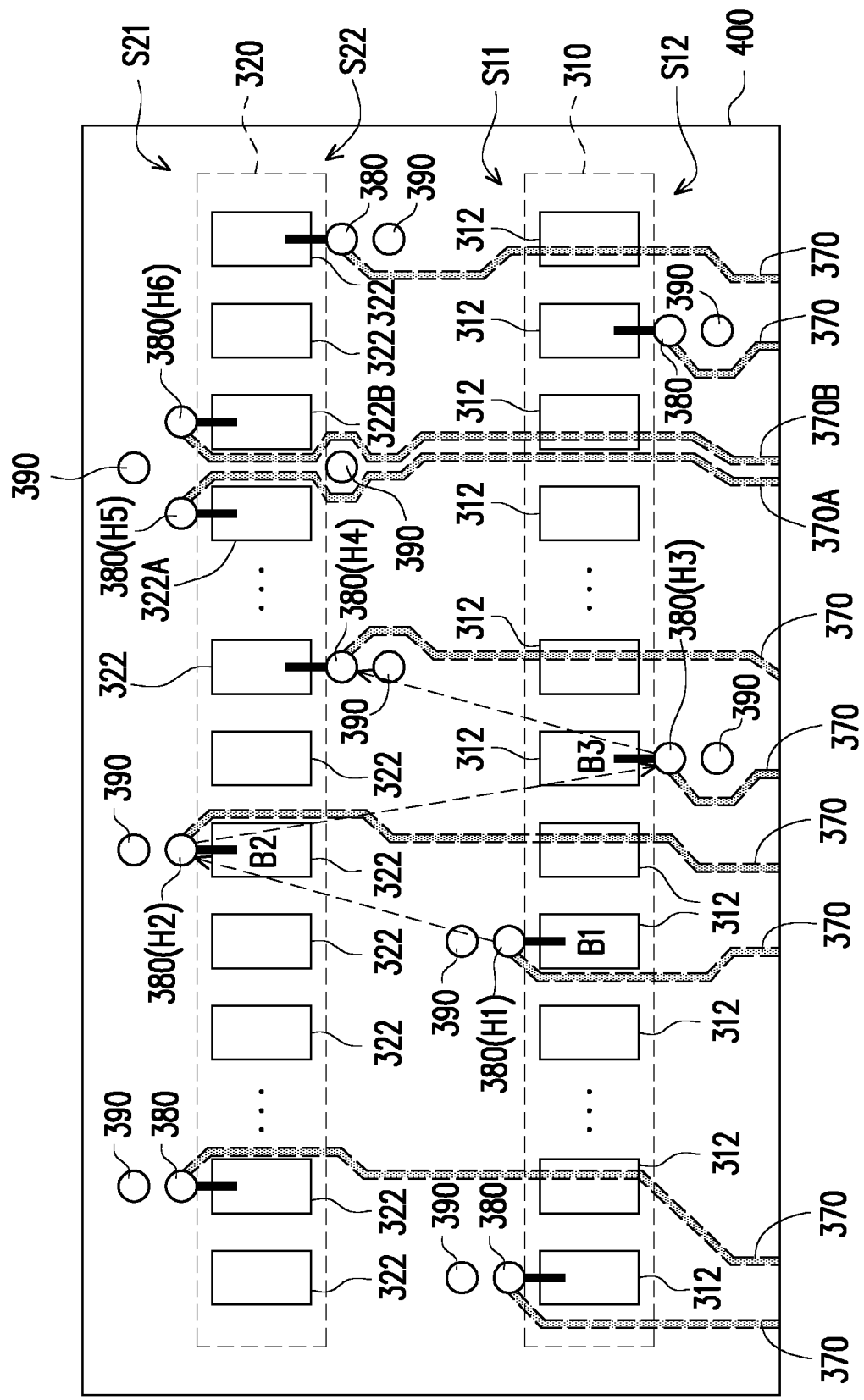
FIG. 4 is a schematic diagram illustrating implementation of a circuit board according to still another embodiment of the invention.

FIG. 4 is a schematic diagram illustrating implementation of a circuit board according to still another embodiment of the invention. With reference to FIG. 3A and FIG. 4 together, a circuit board 400 of FIG. 4 may similarly include the first pin row 310, the second pin row 320, and the signal vias 380. In FIG. 4, the electrical connection relationship between the first pin row 310 and the second pin row 320 and the signal vias 380 can be referred to and inferred from related description of FIG. 3A, and thus is not repeated hereinafter.

Comparing to the three consecutive signal vias H1, H2, and H3 in FIG. 3A which are sequentially disposed at the first side S11 of the first pin row 310, the first side S21 of the second pin row 320, and the second side S12 of the first pin row 310, the four consecutive signal vias H1 to H4 of the signal vias 380 in FIG. 4 are sequentially disposed at the first side S11 of the first pin row 310, the first side S21 of the second pin row 320, the second side S12 of the first pin row 310, and the second side S22 of the second pin row 320. Alternate arrangement of the signal vias H1 to H4 as shown by the dashed arrows in FIG. 4 is thereby formed. In this way, the signal vias H1 to H4 of FIG. 4 are prevented from being located too close to each other, and that crosstalk interference is prevented from being generated. Signal quality of the signal vias H1 to H4 of the circuit board 400 is thereby increased. In addition, other implementation details of the circuit board 400 of FIG. 4 may be referred to related description of the circuit board 300A of FIG. 3A, and a relevant description thereof is thus omitted.

It should be understood that similarly, the five or more consecutive signal vias of the signal vias 380 may sequentially be disposed at the first side S11 of the first pin row 310, the first side S21 of the second pin row 320, the second side S12 of the first pin row 310, and the second side S22 of the second pin row 320 in cycles by the designer for improving signal quality of the circuit board. Thus, details are not repeated hereinafter. Description of a circuit board with a number of pin rows greater than or equal to three is provided as follows.

In an embodiment of the invention, a circuit board may include N pin rows and a plurality of signal vias, wherein N is an integer greater than or equal to 3. Each of the N pin rows includes a first side and a second side. The first side and the second side of each of the N pin rows are opposite to each other. One of the first side and the second side of a Jth pin row of the N pin rows is adjacent to one of the first side and the second side of a J-1th pin row of the N pin rows. A plurality of traces of the circuit board may be electrically connected to a plurality of pins of the N pin rows respectively through the signal vias. Particularly, M consecutive signal vias of the signal vias are sequentially disposed at the first side of each of the N pin rows and the second side of a first pin row of the N pin rows, wherein M=N+1. N=3 is used as an example for description in the following. Description of other embodiments in which N equals to other numerical values may be deduced by analogy according to the description as follows.

Figure 5:
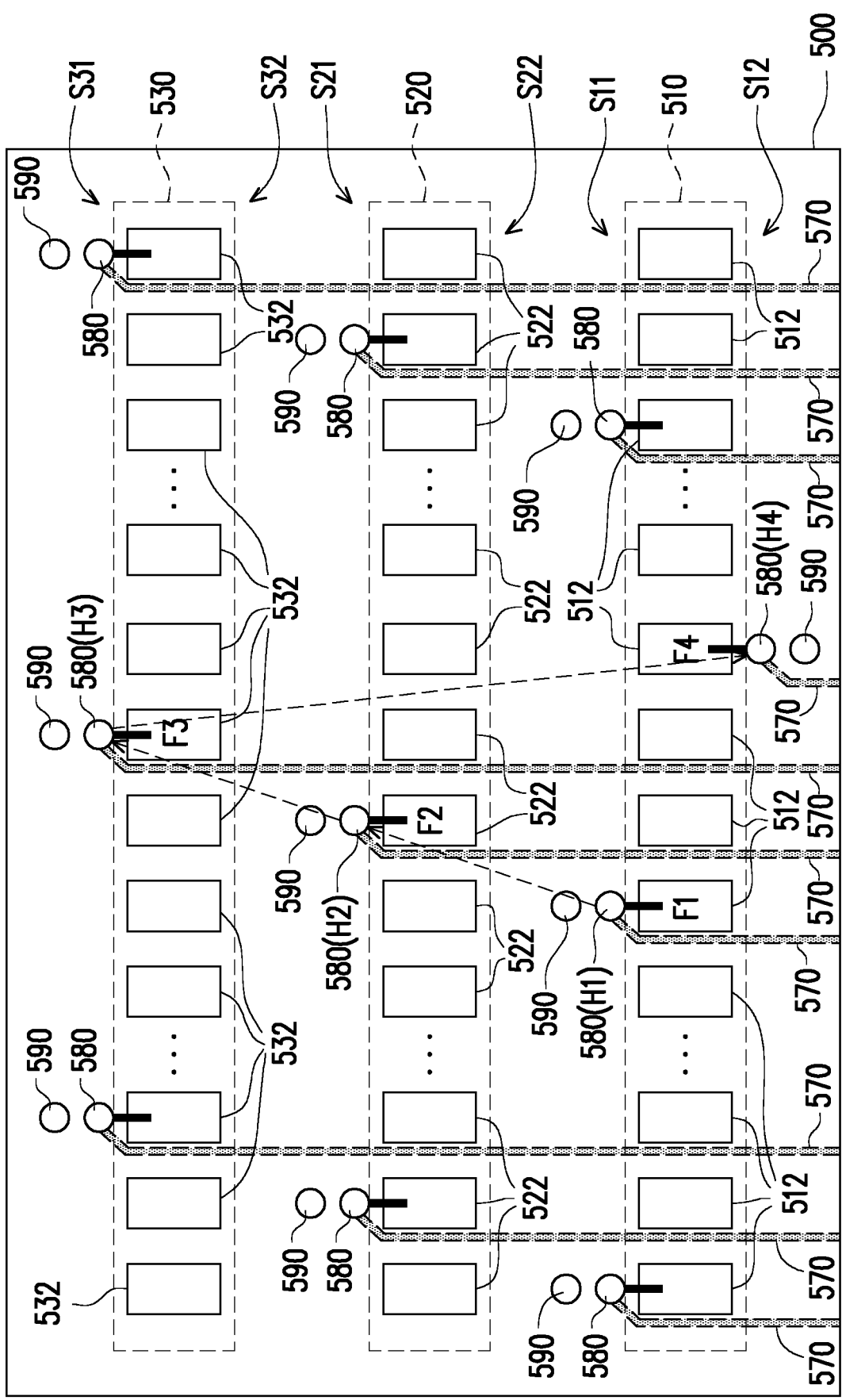
FIG. 5 is a schematic diagram illustrating implementation of a circuit board according to still another embodiment of the invention.

FIG. 5 is a schematic diagram illustrating implementation of a circuit board according to still another embodiment of the invention. As shown in FIG. 5, a circuit board 500 may include a first pin row 510, a second pin row 520, a third pin row 530, and a plurality of signal vias 580. In an embodiment of the invention, the first pin row 510, the second pin row 520, and the third pin row 530 may be, for example, three rows of pins of a surface-mount technology connector, which should however not be construed as limitations to the invention. The first pin row 510 has a plurality of pins 512 sequentially arranged, the second pin row 520 has a plurality of pins 522 sequentially arranged, and the third pin row 530 has a plurality of pins 532 sequentially arranged. Each of the signal vias 580 is adjacent to a corresponding one pin of the pins 512, 522, and 532. A plurality of traces 570 of the circuit board 500 may be electrically connected to the pins 512 of the first pin row 510, the pins 522 of the second pin row 520, and the pins 532 of the third pin row 530 respectively through the signal vias 580. For instance, the signal via H1 is adjacent to a pin F1 of the first pin row 510, and a first trace of the circuit board 500 may be electrically connected to the pin F1 of the first pin row 510 through the signal via H1; the signal via H2 is adjacent to a pin F2 of the second pin row 520, and a second trace of the circuit board 500 may be electrically connected to the pin F2 of the second pin row 520 through the signal via H2; the signal via H3 is adjacent to a pin F3 of the third pin row 530, and a third trace of the circuit board 500 may be electrically connected to the pin F3 of the third pin row 530 through the signal via H3; the signal via H4 is adjacent to a pin F4 of the first pin row 510, and a fourth trace of the circuit board 500 may be electrically connected to the pin F4 of the first pin row 510 through the signal via H4. Nevertheless, the invention should not be construed as limited thereto. In fact, whether the signal via corresponding to each of the pins in the first pin row 510, the second pin row 520, and the third pin row 530 is required to be disposed depends on actual applications or design requirements.

The first pin row 510 includes a first side S11 and a second side S12, wherein the first side S11 and the second side S12 are opposite to each other. The second pin row 520 includes a first side S21 and a second side S22, wherein the first side S21 and the second side S22 are opposite to each other, and the second side S22 of the second pin row 520 is adjacent to the first side Si i of the first pin row 510. The third pin row 530 has a first side S31 and a second side S32, wherein the first side S31 and the second side S32 are opposite to each other, and the second side S32 of the third pin row 530 is adjacent to the first side S21 of the second pin row 520. The four consecutive signal vias H1, H2, H3, and H4 of the signal vias 580 are sequentially disposed at the first side S11 of the first pin row 510, the first side S21 of the second pin row 520, the first side S31 of the third pin row 530, and the second side S12 of the first pin row 510. Alternate arrangement of the signal vias H1, H2, H3, and H4 as shown by the dashed arrows in FIG. 5 is thereby formed. In this way, the signal vias H1, H2, H3 and H4 are prevented from being located too close to each other, and crosstalk interference is thus prevented from being generated. Signal quality of the signal vias H1, H2, H3, and H4 of the circuit board 500 is thereby increased.

It should be understood that similarly, five or more consecutive signal vias of the signal vias 580 may be sequentially disposed at the first side S11 of the first pin row 510, the first side S21 of the second pin row 520, the first side S31 of the third pin row 530, the second side S12 of the first pin row 510, the second side S22 of the second pin row 520, and the second side S32 of the third pin row 530 in cycles by the designer for improving signal quality of the circuit board 500. Thus, details are not repeated hereinafter. In addition, for variations in implementation details of the circuit board 500 of FIG. 5 and positions in which the signal vias 580 of the circuit board 500 are disposed, enough teaching, suggestion, and implementation illustration may be obtained from the above embodiments of FIG. 1 to FIG. 4, and that detailed descriptions are not further provided hereinafter.

Figure 6:
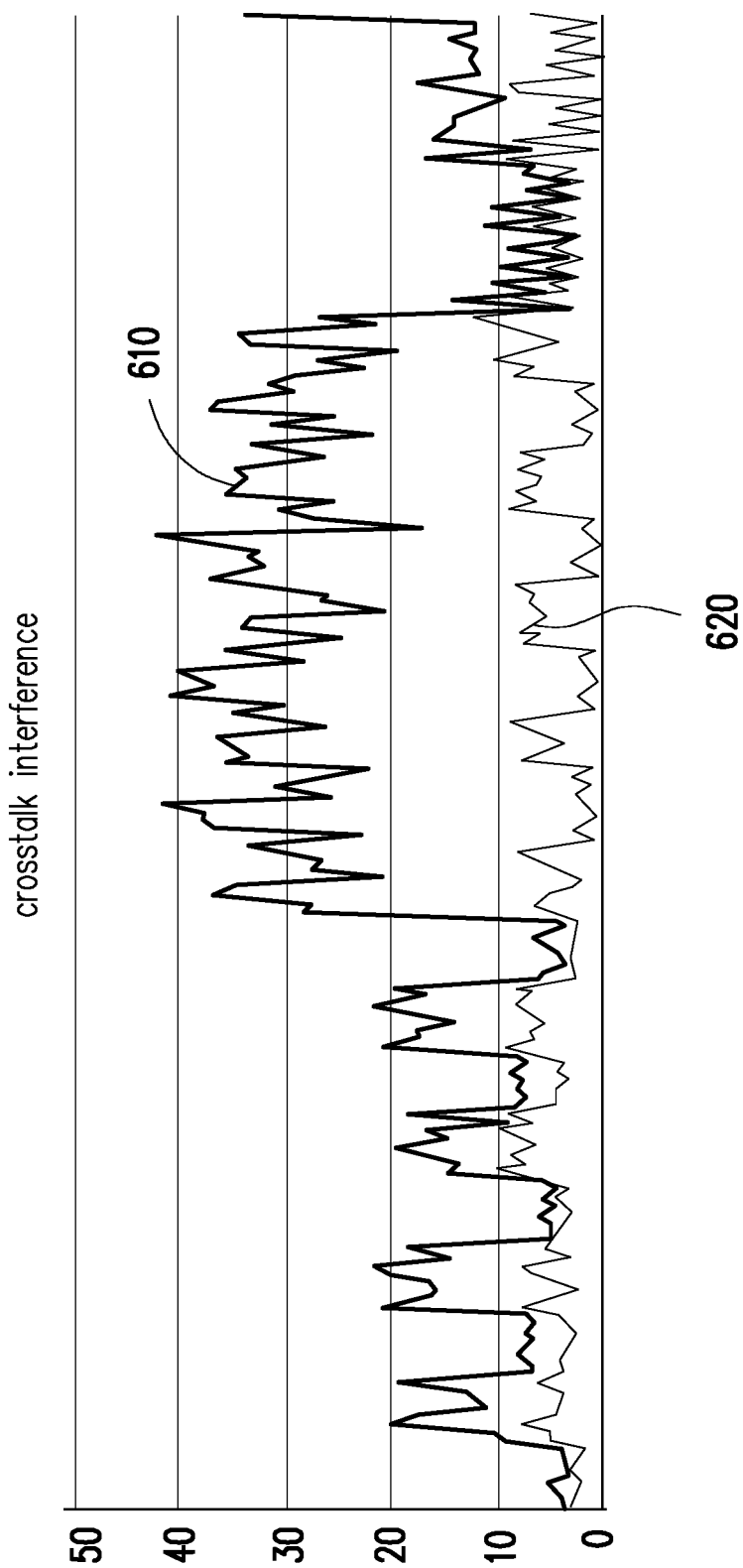
FIG. 6 is a schematic chart of a crosstalk interference value of at least one pin row of a circuit board.
Figure 7:
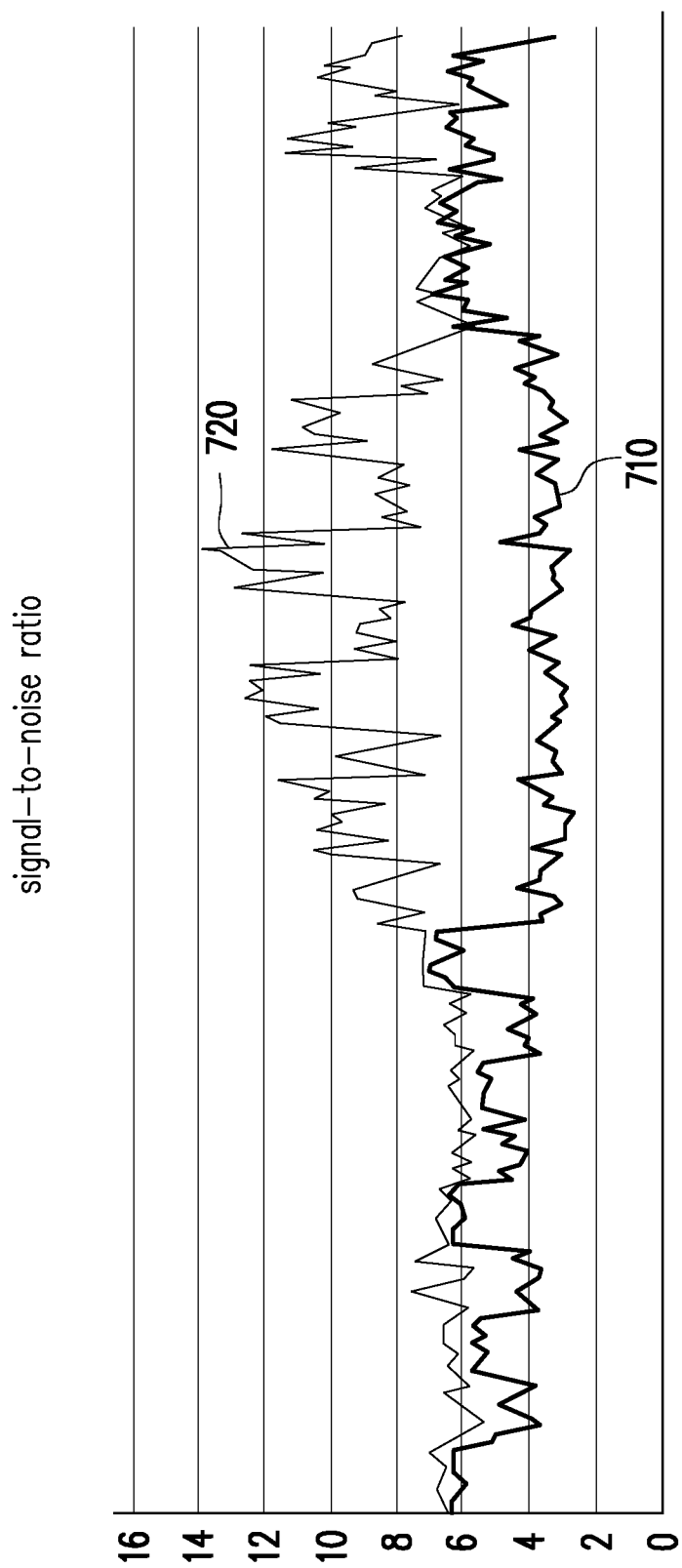
FIG. 7 is a schematic chart of a signal-to-noise ratio of at least one pin row of a circuit board.

FIG. 6 is a schematic chart of a crosstalk interference value of at least one pin row of a circuit board. In FIG. 6, the horizontal axis represents numbering of pins in the at least one pin row, and the vertical axis represents a crosstalk interference value of each of the pins measured. The measured crosstalk interference value that the signal vias are disposed at a same side of the at least one pin row is labeled as 610. The measured crosstalk interference value that the signal vias are disposed at different sides of the at least one pin row is labeled as 620. In addition, FIG. 7 is a schematic chart of a signal-to-noise ratio of at least one pin row of a circuit board. In FIG. 7, the horizontal axis represents numbering of pins in the at least one pin row, and the vertical axis represents the signal-to-noise ratio of each of the pins. The measured signal-to-noise ratio that the signal vias are disposed at a same side of the at least one pin row is labeled as 710. The measure signal-to-noise ratio that the signal vias are disposed at two opposite sides of the at least one pin row is labeled as 720. It thus can be seen that in FIG. 6 and FIG. 7, in the circuit board provided by the embodiments of the invention, a lower crosstalk interference value and a higher signal-to-noise ratio can be provided when the signal vias of the pins are alternately disposed at different sides of the at least one pin row.

In view of the foregoing, in the circuit board provided by the embodiments of the invention, the signal vias of the at least one pin row of the circuit board are alternately disposed at two opposite sides of the at least one pin row. In this way, the signal vias are prevented from being located too close to each other, and therefore, signal quality of the circuit board is increased.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit board, comprising:
    a first pin row, having a first side and a second side, wherein the first side of the first pin row and the second side of the first pin row are opposite to each other;
    a second pin row, having a first side and a second side, wherein the first side of the second pin row and the second side of the second pin row are opposite to each other, and one of the first side and the second side of the second pin row is adjacent to one of the first side and the second side of the first pin row;
    a third pin row, having a first side and a second side, wherein the first side of the third pin row and the second side of the third pin row are opposite to each other, and one of the first side and the second side of the third pin row is adjacent to one of the first side and the second side of the second pin row; and
    a plurality of signal vias, wherein a plurality of traces of the circuit board are electrically connected to a plurality of pins of the first pin row and a plurality of pins of the second pin row respectively through the signal vias,
    wherein four consecutive signal vias of the signal vias are sequentially disposed at the first side of the first pin row, the first side of the second pin row, the first side of the third pin row, and the second side of the first pin row.

2. The circuit board as claimed in claim 1, wherein the signal vias comprise:
    a differential signal pair via, the differential signal pair via being disposed at a same side of the first pin row or a same side of the second pin row.

3. A circuit board, comprising:
    N pin rows, each of the N pin rows having a first side and a second side, wherein the first side and the second side of each of the N pin rows are opposite to each other, and one of the first side and the second side of a Jth pin row of the N pin rows is adjacent to one of the first side and the second side of a J−1th pin row of the N pin rows, wherein N is an integer greater than or equal to 3; and
    a plurality of signal vias, wherein a plurality of traces of the circuit board are electrically connected to a plurality of pins of the N pin rows respectively through the signal vias,
    wherein M consecutive signal vias of the signal vias are sequentially disposed at the first side of each of the N pin rows and the second side of a first pin row of the N pin rows, wherein M=N+1.

* * * * *